US006114748A

United States Patent [19]

Nagano et al.

[11] Patent Number: 6,114,748

[45] Date of Patent: Sep. 5, 2000

[54] AC PLASMA DISPLAY PANEL PROVIDED WITH GLAZE LAYER HAVING CONDUCTIVE MEMBER

[75] Inventors: Shinichiro Nagano, Tokyo; Yoshiharu Ogawa, Fukuoka; Masayuki Hiroshima, Fukuoka; Hirotoshi Takechi, Fukuoka, all of Japan

[73] Assignees: Mitsubishi Denki Kabushiki Kaisha, Tokyo; Noritake Co., Limited, Aichi-ken; Kyushu Noritake Co., Ltd., Fukuoka-ken, all of Japan

[21] Appl. No.: 09/100,944

[22] Filed: Jun. 22, 1998

[30] Foreign Application Priority Data

Jun. 27, 1997 [JP] Japan .................................... 9-171806

[51] Int. Cl.$^{7}$ ..................................................... H01L 23/58

[52] U.S. Cl. ............................................. 257/632; 257/79

[58] Field of Search ........................ 345/59–72; 257/632, 257/79

[56] References Cited

FOREIGN PATENT DOCUMENTS 4-47639 2/1992 Japan .

*Primary Examiner*—David Hardy

[57] ABSTRACT

In an AC plasma display panel having a glaze layer covering address electrodes, a proper amount of conductive filler is introduced into the glaze layer, to lower the volume resistivity of the glaze layer. Thus, generation of spark discharge can be suppressed in driving the display panel.

17 Claims, 7 Drawing Sheets

⟨PRIOR ART⟩

⟨PRIOR ART⟩

<BACKGROUND ART>

AC PLASMA DISPLAY PANEL PROVIDED WITH GLAZE LAYER HAVING CONDUCTIVE MEMBER

BACKGROUND OF THE INVENTION

1. Field of the Invention

The present invention relates to a technique for improving display stability of an AC plasma display panel and a display unit employing the same.

2. Description of the Background Art

FIG. 2 is a perspective view showing the discharge cell structure of a conventional AC surface discharge type plasma display panel. Referring to FIG. 2, numeral 1 denotes transparent electrodes, numeral 2 denotes bus electrodes, consisting of a metal, for supplying voltage to the transparent electrodes 1, numeral 3 denotes a uniform dielectric layer covering the transparent electrodes 1 and the bus electrodes 2, numeral 4 denotes an MgO film serving as a cathode for discharge, and numeral 5 denotes a front glass substrate carrying the transparent electrodes 1, the bus electrodes 2, the dielectric layer 3 and the MgO film 4 thereon.

Numeral 6 denotes address electrodes perpendicularly intersecting with the bus electrodes 2, numeral 10 denotes a uniform glaze layer covering the address electrodes 6, numeral 7 denotes barrier ribs for separating the address electrodes 6 from each other, and numeral 8 denotes fluorescent bodies which are formed on a surface of the glaze layer 10 and wall surfaces of the barrier ribs 7. Symbols R, G and B denote the types of fluorescent colors, i.e., red, green and blue respectively.

Numeral 9 denotes a rear glass substrate carrying the address electrodes 6, the barrier ribs 7, the fluorescent bodies 8 and the glaze layer 10 thereon. Top portions of the barrier ribs 7 are in contact with the MgO film 4, to define discharge spaces, enclosed with the fluorescent bodies 8 and the MgO film 4, which are filled up with mixed gas such as Ne+Xe.

In this structure, a pair of transparent electrodes 1 and a pair of bus electrodes 2, i.e., a pair of sustain discharge electrodes Xn and Yn form an n-th scan line. Together scan lines intersect with the address electrodes 6 to define discharge cells at the intersection points respectively, and these discharge cells are arranged in the form of a matrix to form the plasma display panel.

The plasma display panel having the aforementioned structure is driven to obtain a desired image through the following driving sequence [1] to [4] described:

[1] Line-Sequential Write Discharge

A sustain discharge electrode group {Yn} is line-sequentially scanned and an image data signal for selection/non-selection is inputted in each address electrode 6 in synchronization therewith, thereby causing write discharge between the sustain discharge electrodes Xn and Yn in a selected cell. When the write discharge is completed, wall charges are stored on the surface of the MgO film 4 in the vicinity of the sustain discharge electrodes Xn and Yn in the selected cell.

[2] Sustain Discharge

A prescribed number of sustain discharge pulses are applied between the sustain discharge electrodes Xn and Yn on the overall panel. Thus, sustain discharge is generated between the sustain discharge electrodes Xn and Yn by a prescribed number in the cell selected in the process [1], due to interaction with a potential by the wall charges.

[3] Priming Discharge

Sufficient voltage pulses are applied between the sustain discharge electrodes Xn and Yn, in order to cause discharge between the sustain discharge electrodes Xn and Yn only once in all cells regardless of presence/absence of wall charges.

[4] Erase Discharge

Erase pulses are applied between the sustain discharge electrodes Xn and Yn in all cells to generate erase discharge therebetween, for sufficiently erasing the wall charges from the surface of the MgO film 4. Thus, information of the screen is reset so that the process [1] for the next screen enters a standby state.

The fluorescent bodies 8 are excited by ultraviolet light emitted from each of the aforementioned discharge, to emit visible light of red, green and blue. Thus, a desired image is obtained mainly by the sustain discharge [2].Each of the aforementioned discharge is generated between the sustain discharge electrodes Xn and Yn, and the address electrodes 6, which are adapted to prompt write discharge between the sustain discharge electrodes Xn and Yn mainly in the process [1], hardly serve as discharge electrodes for gas discharge.

When the plasma display panel having the structure shown in FIG. 2 was driven in practice, however, generation of "spark discharge" was visually observed in a normal image (or discharge). This spark discharge has the following characteristics (1) to (5):

(1) The duration of each spark discharge is visually unmeasurably short. This duration, which is shorter than the afterglow time of the fluorescent bodies 8, is conceivably not more than 1 msec.

(2) The luminous intensity of each spark discharge is instantaneous but extremely high. The luminous intensity is certainly higher than that of single normal gas discharge between the sustain discharge electrodes Xn and Yn.

(3) The frequency and the generable portion of the spark discharge vary with the image. In general, it tends to appear on a relatively dark portion which is in proximity to a bright portion in the screen.

(4) Most spark discharge exhibits linear emission over a span of several to several 10s of cells in a direction parallel to the barrier ribs 7. While spreading in a direction perpendicular to the barrier ribs 7 is relatively weak, planar emission over a span of several 10s of to one hundred and several 10 barrier ribs 7 sometimes appears.

(5) While the frequency of the spark discharge is substantially not more than once per several seconds, it may hardly appear depending on the image. In particular, absolutely no spark discharge appears when a black image is displayed on the overall screen.

It is certain that such spark discharge, which is a visually observable irregular emission causes a problem in the quality of the panel and is undesirable for a display unit when considering of display stability.

SUMMARY OF THE INVENTION

According to a first aspect of the present invention, an AC plasma display panel comprises a first substrate, a second substrate which is opposed to the first substrate to define a discharge space filled up with discharge gas in the space defined therebetween, a plurality of sustain discharge electrode pairs which are formed on a first part of the first substrate in parallel with each other, a dielectric member which is formed on a second part of the opposite surface of the first substrate which covers the plurality of sustain discharge electrode pairs, a plurality of address electrodes which are formed on a first part of an opposite surface of the second substrate in a direction intersecting with that provided with the sustain discharge electrode pairs, and a glaze layer which is formed on a second part of the opposite surface of the second substrate for covering the plurality of address electrodes, and the glaze layer comprises a conductive member.

According to the first aspect of the present invention, the glaze layer includes the conductive member, whereby spark discharge generated when driving the AC plasma display panel can be eliminated.

According to a second aspect of the present invention, the glaze layer is composed of an insulating inorganic binder and a conductive filler which is dispersed therein, and the conductive filler comprises a conductive oxide.

According to a third aspect of the present invention, the weight composition ratio of the conductive oxide is at least 2%.

According to the third aspect of the present invention, an effect of reliably reducing spark discharge can be attained by setting the weight composition ratio of the conductive oxide occupying the glaze layer at the level of at least 2%.

According to a fourth aspect of the present invention, the conductive filler comprises tin oxide as the conductive oxide.

According to the fourth aspect of the present invention, the glaze layer contains tin oxide, whereby spark discharge can be eliminated while maintaining sufficient isolation between the address electrodes.

According to a fifth aspect of the present invention, the conductive filler comprises indium oxide as the conductive oxide.

According to the fifth aspect of the present invention, the glaze layer contains indium oxide, whereby spark discharge can be eliminated while maintaining sufficient isolation between the address electrodes.

According to a sixth aspect of the present invention, a display unit comprises a display part and a driving part which is connected to first, second and third electrodes of each discharge cell of the display part which supplies a driving signal for displaying an image on the display part to each of the first to third electrodes, and the display part comprises a first substrate, a second substrate which is opposed to the first substrate to define a discharge space filled up with discharge gas in its opposite space, a plurality of sustain discharge electrode pairs which are formed on a first part of an opposite surface of the first substrate in parallel with each other, and each of the plurality of sustain discharge electrode pairs comprises the first and second electrodes, a dielectric member which is formed on a second part of the opposite surface of the first substrate which covers the plurality of sustain discharge electrode pairs, a plurality of address electrodes which are formed on a first part of an opposite surface of the second substrate in a direction intersecting with that provided with the first and second electrodes, and each of the plurality of address electrodes corresponds to the third electrode, and a glaze layer which is formed on a second part of the opposite surface of the second substrate which covers the plurality of address electrodes, and comprising a conductive member.

According to the sixth aspect of the present invention, the display unit is formed by an AC plasma display panel having the glaze layer including the conductive member, whereby the display unit can display an image not influenced by noise resulting from spark discharge.

According to a seventh aspect of the present invention, a display panel substrate comprises a substrate, a plurality of electrode lines which are formed on a major surface of the substrate in parallel with each other, and a glaze layer, formed on another part of the major surface of the substrate to entirely cover the plurality of electrode lines, comprising a conductive member.

An object of the present invention is to improve the quality of a panel by implementing a panel structure capable of eliminating spark discharge thereby improving display stability of a display unit employing the panel.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An AC plasma display panel according to the present invention and a display unit employing this plasma display panel are now described with reference to the drawings showing embodiments thereof. Referring to FIGS. 1, 3, 4, 6 and 7, numerals and symbols identical to those shown in FIG. 2 denote the same or corresponding elements.

Noted Points

Before describing the embodiments of the present invention in detail, consideration is made of the mechanism that generates spark discharge. In relation to this consideration, results of key experiments {1} to {3} are now described.

{1} An experiment was made as to how the generation of spark discharge varies with driving conditions, to confirm that the generation frequency of spark discharge varies with the voltage applied to the address electrodes 6. On the other hand, it was also confirmed that the generation frequency is not very dependent on the voltage applied to the sustain discharge electrodes Xn and Yn.

{2} An experiment was made on glaze layers 10 having various thicknesses, to confirm that the generation frequency of spark discharge reduces as the thicknesses increase.

Figure 3:
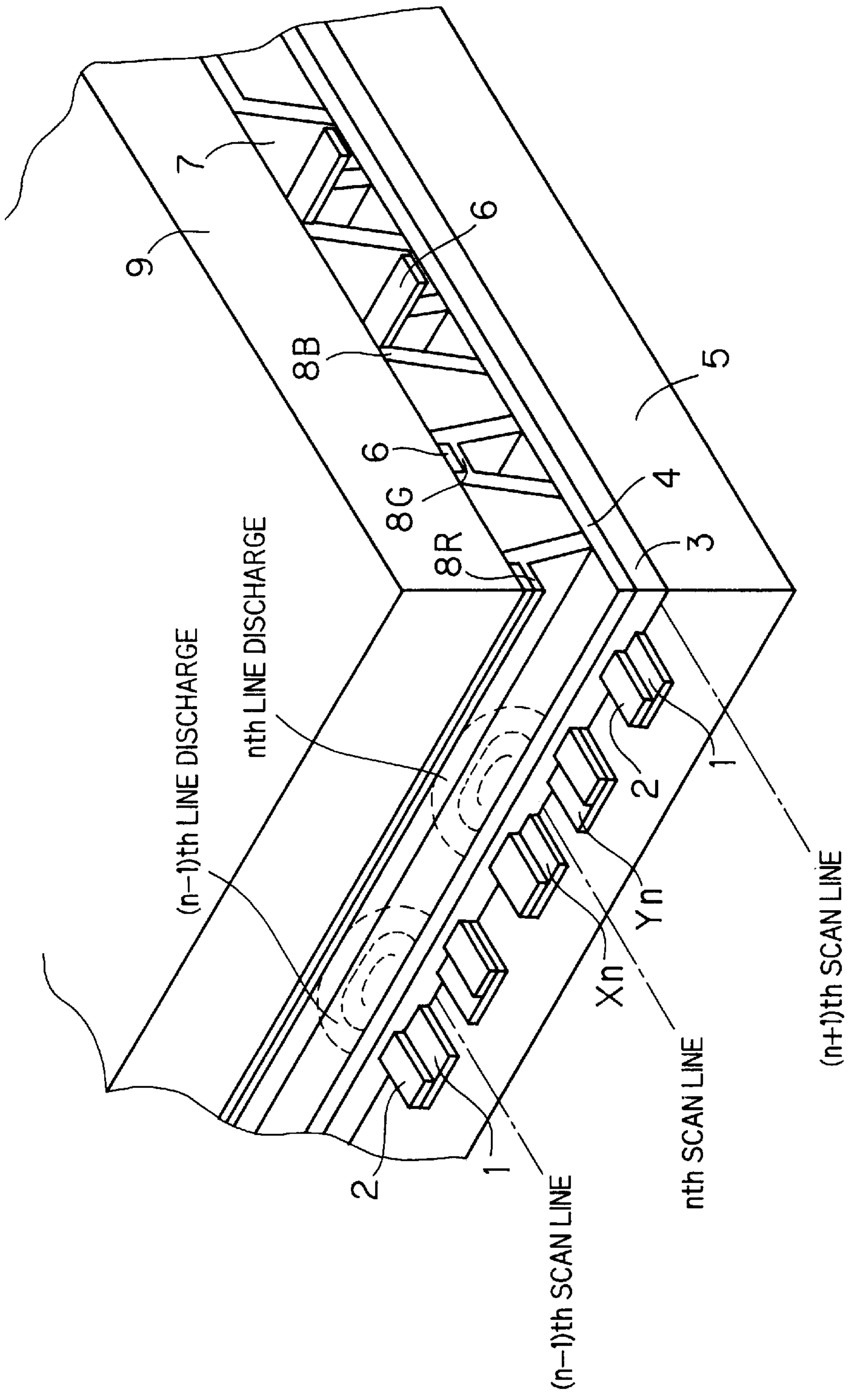
FIG. 3 is a perspective view showing the internal structure of an AC plasma display panel having no glaze layer.

{3} When driving a plasma display panel, provided with no glaze layer 10, having a structure shown in FIG. 3, a stable image is obtained absolutely with no appearance of spark discharge.

Figure 4:
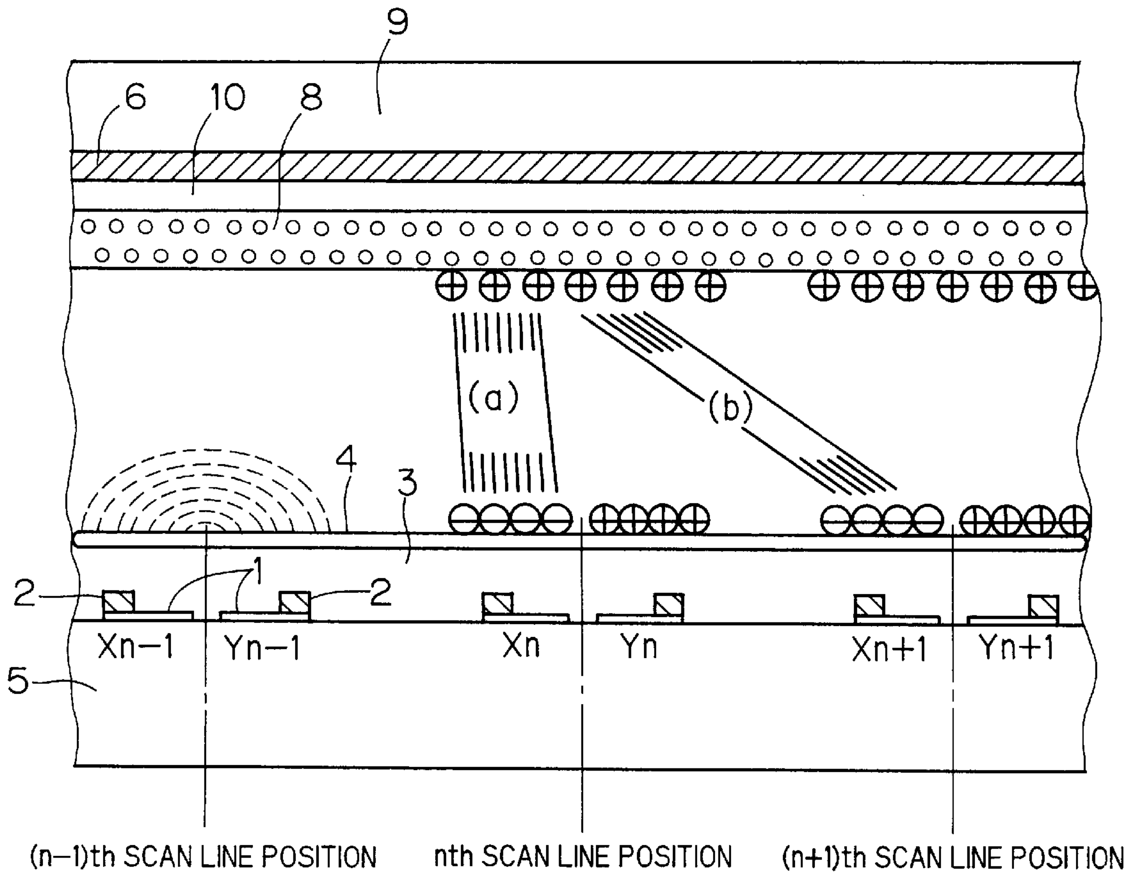
FIG. 4 is a sectional view of an internal structure for illustrating the mechanism of spark discharge caused in the conventional AC plasma display panel.

It has been inferred from the aforementioned experimental results that spark discharge is caused since charges are stored in the upper glaze layer 10 and the fluorescent bodies 8 to charge up at a certain timing. FIG. 4 illustrates the plasma display panel having the structure shown in FIG. 2 along a section perpendicular to scan lines including the line center axis of a certain address electrode 6, in order to explain the inferred mechanism.

Since each of write discharge, sustain discharge and priming discharge frequently takes place between the sustain discharge electrodes Xn and Yn in a capacitive coupling manner, a number of timings storing a considerable quantity of wall charges are present on the surface of the MgO film 4 in proximity to upper portions of the sustain discharge electrodes Xn and Yn through the dielectric layer 3. On the other hand, the address electrodes 6 hardly take part in such series of discharge as hereinabove described, while various charged particles generated in a plasma space resulting from gas discharge between the sustain discharge electrodes Xn and Yn include those trapped on surfaces of the fluorescent bodies 8 in proximity to the address electrodes 6 due to electric fields developed by the address electrodes 6. The probability of such trapping conceivably depends on the strength of the electric fields developed by the address electrodes 6, i.e., the voltage applied to the address electrodes 6.

Charges provided in the trapped charged particles transfer to the fluorescent bodies 8, which are porous substances consisting of aggregates of powder in general, readily flow out to the address electrodes 6 when the fluorescent bodies 8 directly define interfaces with the address electrodes 6 as shown in FIG. 3. In the structure shown in FIG. 3, therefore, the quantity of charges stored in the fluorescent bodies 8 reaches an equilibrium state at a relatively low level.

Figure 2:
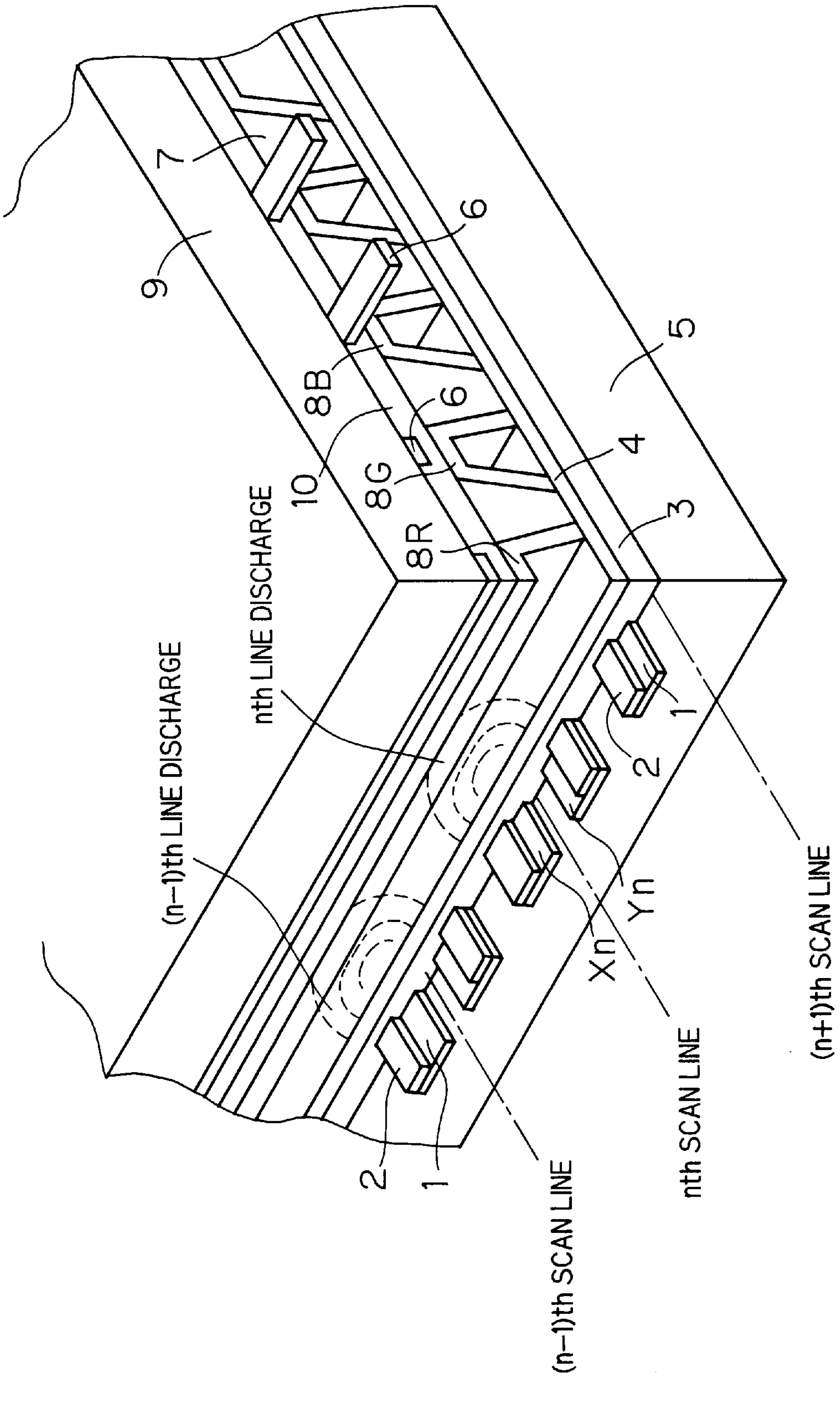
FIG. 2 is a perspective view showing the internal structure of an exemplary conventional AC plasma display panel.

In the structure shown in FIG. 2 or 4, on the other hand, the charges trapped by the fluorescent bodies 8 cannot escape to the address electrodes 6 due to the insulating glaze layer 10 held between the fluorescent bodies 8 and the address electrodes 6. In the structure shown in FIG. 2 or 4, therefore, an equilibrium state is not attained until a considerable quantity of charges are stored in the fluorescent bodies 8 or the glaze layer 10, due to the electrostatic capacitance of the glaze layer 10 covering the address electrodes 6. While charges are stored in the fluorescent bodies 8 or the glaze layer 10 of the structure shown in FIG. 2 or 4 in larger quantity as compared with the structure shown in FIG. 3, the quantity of storable charges increases as the thickness of the glaze layer 10 reduces, due to increase of the electrostatic capacitance.

When the quantity of the charges stored in the fluorescent bodies 8 or the glaze layer 10 exceeds a certain level, since the voltage applied to the address electrodes 6 has a synergistic effect, there is a possibility that gas discharge is caused between the address electrode 6 and the sustain discharge electrodes Xn or Yn which are opposed to each other through the discharge spaces. This probability increases particularly at such a timing that the charges stored in the fluorescent bodies 8 or the glaze layer 10 and the voltage applied to the address electrodes 6 are of the same polarity and both of the wall charges present on the surface of the MgO film 4 in the vicinity of the upper portions of the sustain discharge electrodes Xn or Yn and the voltage applied to the sustain discharge electrodes Xn or Yn are in reverse polarity thereto. It is conceivable that the aforementioned experimental results {1} to {3} can be reasonably explained by regarding this as the cause for the spark discharge.

The spark discharge conceivably takes place in the interior of the discharge cells as shown at (a) in FIG. 4 and at a distance along the discharge spaces having continuity in parallel with the pattern of the barrier ribs 7 as shown at (b) in FIG. 4. It is inferred that triggered spark discharge which takes place on one portion spreads along the continuous discharge spaces, to result in the aforementioned characteristic (4) to be solved by the present invention.

When considering that the triggered spark discharge probably takes place in an ON-state cell during the period of sustain discharge (the process [2] in the driving sequence in the description of the background art) frequently generated between the sustain discharge electrodes Xn and Yn and spreads to OFF-state regions in the period of priming (the process [3] in the driving sequence), the aforementioned characteristic (3) and the characteristic (5) in which no spark discharge takes place under black display on the overall screen can be explained. It is conceivable that spark discharge taking place in the interior of the region of the ON-state cell is hidden in normal light emission and cannot be visually recognized.

This spark discharge can be completely suppressed by employing the structure having no glaze layer as shown in FIG. 3. However, the glaze layer 10 is adapted to reflect the light emitted from the fluorescent bodies 8 for improving the brightness of the display due to a white pigment generally dispersed therein (refer to Japanese Patent Laying-Open Gazette No. 4-47639 (1992)), removal of the glaze layer 10 leads to loss of the quality.

The glaze layer 10 is also adapted to improve reliability in prevention of dielectric breakdown of the dielectric layer 3. Since the fluorescent bodies 8 are porous substances consisting of aggregates of powder as hereinabove described, there is substantially no voltage-resistant coat for the address electrodes 6 in the structure shown in FIG. 3. Depending on pinholes contained in the dielectric layer 3, therefore, such a probability that DC discharge with zero load takes place between the address electrodes 6 and the sustain discharge electrodes Xn and Yn, immediately leading to dielectric breakdown of the dielectric layer 3 or disconnection of the address electrodes 6 and the sustain discharge electrodes Xn and Yn. In the structure shown in FIG. 2, on the other hand, the glaze layer 10 covers the address electrodes 6 to serve as a voltage-resistant coat. Therefore, this structure is remarkably advantageous in reliability in prevention of dielectric breakdown of the dielectric layer 3.

In addition, the glaze layer 10 serves as an interfacial barrier between the fluorescent bodies 8 and the address electrodes 6. In such a structure that the fluorescent bodies 8 and the address electrodes 6 directly define interfaces as shown in FIG. 3, the surfaces of the fluorescent bodies 8 may be locally discolored due to contamination with foreign matter or the like through heat treatment in the fabrication process for the plasma display panel. This problem can also be substantially solved by the glaze layer 10 serving as an interfacial barrier in the structure shown in FIG. 2.

Thus, the glaze layer 10 can be regarded as an indispensable element in function. While a certain degree of effect can be attained for suppressing spark discharge under the structure having the glaze layer 10 as shown in FIG. 2 by adjusting the voltage applied to the address electrodes 6 or increasing the thickness of the glaze layer 10 as hereinabove described, it has been confirmed that none of these means is definitive. Further, the adjustment of the voltage applied to the address electrodes 6 is not much allowable since this adjustment sensitively influences write discharge in the aforementioned driving sequence.

On the other hand, it has also been confirmed that write discharge hardly takes place while erroneous discharge readily takes place due to interference between the adjacent address electrodes 6 if the thickness of the glaze layer 10 is increased. Therefore, it has been judged that these means are restrictive in effect and inferior in implementability in relation to drivability.

The following embodiments of the present invention are adapted to suppress spark discharge while neither damaging the function of the glaze layer nor inhibiting driving.

First Embodiment

Figure 1:
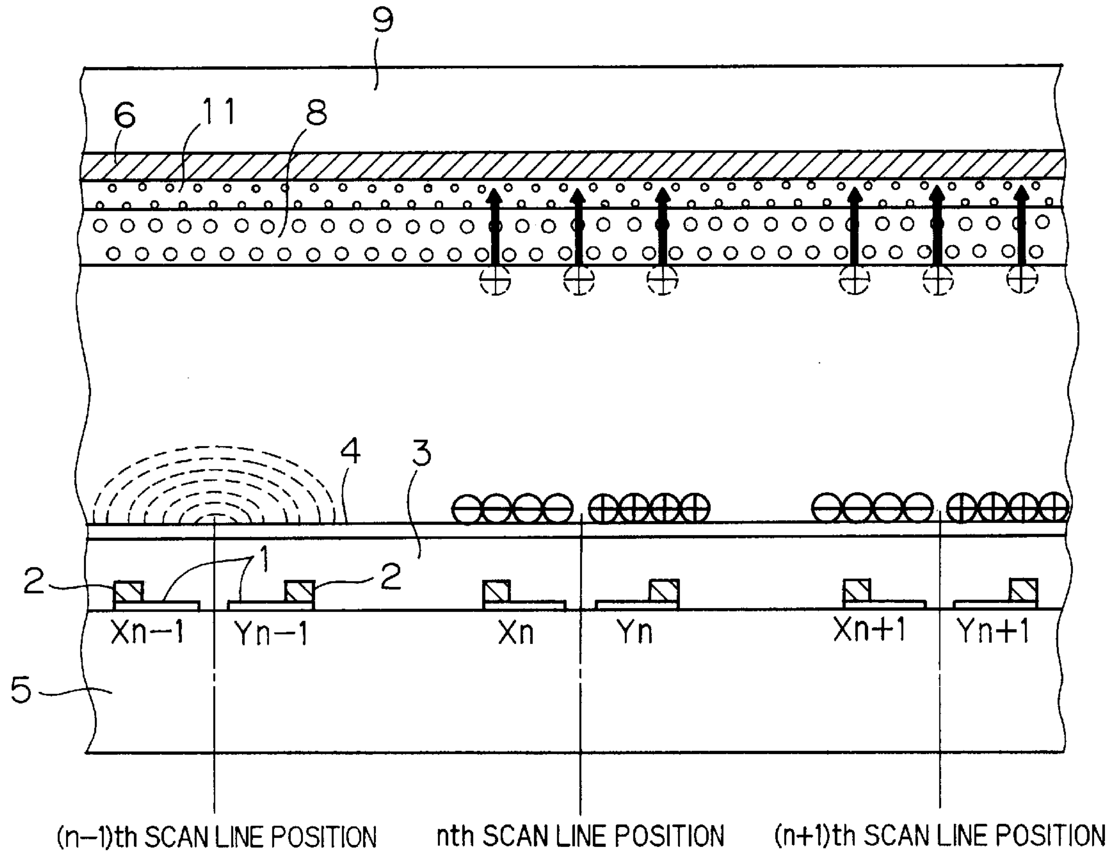
FIG. 1 is a sectional view showing the internal structure of an AC plasma display panel according to the present invention.

FIG. 1 shows the structure of a plasma display panel (hereinafter also referred to as a PDP) according to a first embodiment of the present invention along a section similar to that shown in FIG. 4. Referring to FIG. 1, numeral 11 denotes a glaze layer, in which a conductive material is dispersed/contained, having smaller insulation resistance as compared with the glaze layer 10 shown in FIG. 4. Thick arrows show paths through which charges stored in fluorescent bodies 8 or the glaze layer 11 escape to address electrodes 6 across the glaze layer 11. Due to the low insulation resistance of the glaze layer 11, the quantity of charges present in the glaze layer 11 or the fluorescent bodies 8 is smaller than that in the structure shown in FIG. 4. Therefore, spark discharge can be prevented by adjusting the insulation resistance value of the glaze layer 11.

Figure 7:
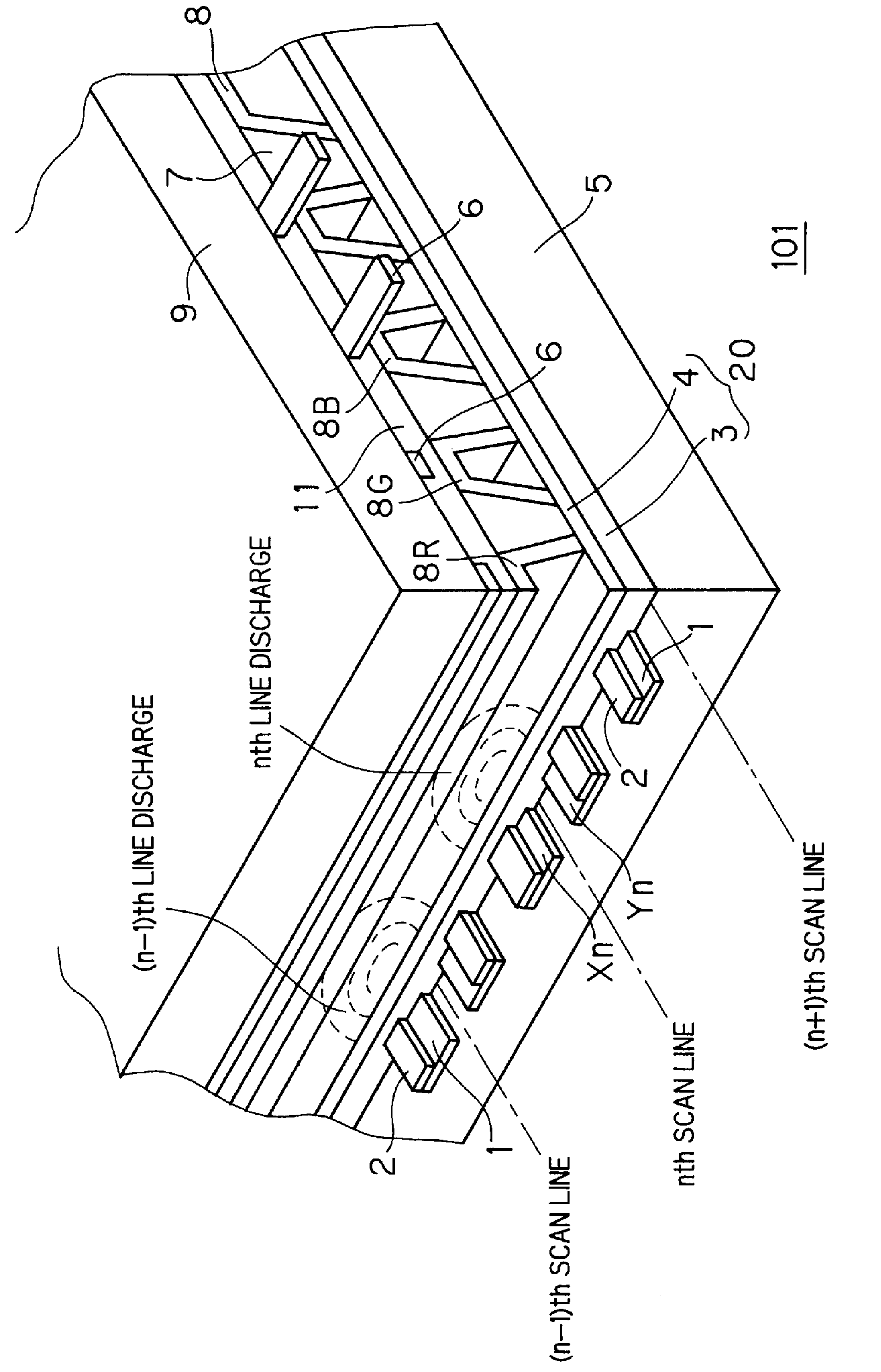
FIG. 7 is a perspective view showing a sectional structure of the plasma display panel according to the present invention.

FIG. 7 is a partially fragmented perspective view showing a PDP 101 having the structure shown in FIG. 1. Referring to FIG. 7, numeral 5 denotes a first substrate, and numeral 9 denotes a second substrate which is opposed to the first substrate 5 to define a discharge space filled up with discharge gas in the opposite space. Numeral 7 denotes barrier ribs, numeral 8 denotes fluorescent layers, numeral 6 denotes address electrodes (third electrodes), and symbols Xn and Yn denote first and second electrodes forming sustain discharge electrode pairs. A dielectric layer 3 and an MgO film 4 are generically referred to as a dielectric member 20. The electrode pairs consisting of the first and second electrodes Xn and Yn are formed on a first part of the first substrate 5, while the dielectric layer 3 is formed on a second part of the first substrate 5 excluding the first part. The respective third electrodes or electrode lines 6 are formed on a first part of the second substrate 9 in parallel with each other, and the glaze layer 11 is formed on a second part of the second substrate 9 excluding the first part, to entirely cover the electrode lines 6.

Adjustment of the insulation resistance value of the glaze layer 11 is now described in detail. In general, the conventional glaze layer 10 has such a composition that an insulating filler such as aluminum oxide or titanium oxide is dispersed/contained in an inorganic binder mainly composed of lead oxide or the like (refer to Japanese Patent Laying-Open Gazette No. 4-47639 (1992)). In such a composition, the volume resistivity is at least $10^{15}$ Ω·cm in general, and generation of spark discharge is inevitable as hereinabove described.

To this end, the inventors have tried to form a glaze layer 11 having lower volume resistivity by partially or entirely replacing a filler with a conductive material.

While the volume resistivity is reduced, sufficient isolation must be maintained between the adjacent address electrodes 6 in driving. Therefore, the inventors have tried to maximize the adjustment width of the replacement ratio by the aforementioned conductive material, inferred that a metal oxide having higher specific resistance as compared with a metal or the like is optimum for the conductive material, and applied $SnO_2$ or $In_2O_3$ as a typical one thereof.

The inventors have employed ZnO glass and $Al_2O_3$ for an inorganic binder and an insulating filler respectively for forming glaze layers of various compositions, and made an experiment. In relation to the various glaze layers, Table 1 shows the types of the applied conductive oxide fillers and data of the weight composition ratios of the conductive oxide filler, the $Al_2O_3$ filler and the inorganic binder forming each glaze layer, with actually measured values of the volume resistivity of the glaze layers and relative frequencies of the numbers of spark discharge observed in AC plasma display panels employing these glaze layers.

TABLE 1

| Sample | Type of Conductive Filler (Mean Grain Size) | Composition Ratio of Conductive Filler | Composition Ratio of $Al_2O_3$ Filler | Composition Ratio of Inorganic Binder | Volume Resistivity [Ω · cm] | Relative Frequency of Spark Discharge |
|---|---|---|---|---|---|---|
| A | — | 0% | 15% | 85% | $2.0 \times 10^{15}$ | 100% |
| B | $SnO_2$(0.8 μm) | 7.5% | 7.5% | ↑ | $7.9 \times 10^{13}$ | 13% |
| C | ↑ | 15% | 0% | ↑ | $1.6 \times 10^{11}$ | 0% |
| D | $In_2O_3$(4.2 μm) | 7.5% | 7.5% | ↑ | $9.1 \times 10^{11}$ | 0% |
| E | ↑ | 15% | 0% | ↑ | $1.3 \times 10^{9}$ | 0% |
| F | $SnO_2$(3.1 μm) | 15% | 0% | ↑ | $9.6 \times 10^{9}$ | 0% |

Figure 5:
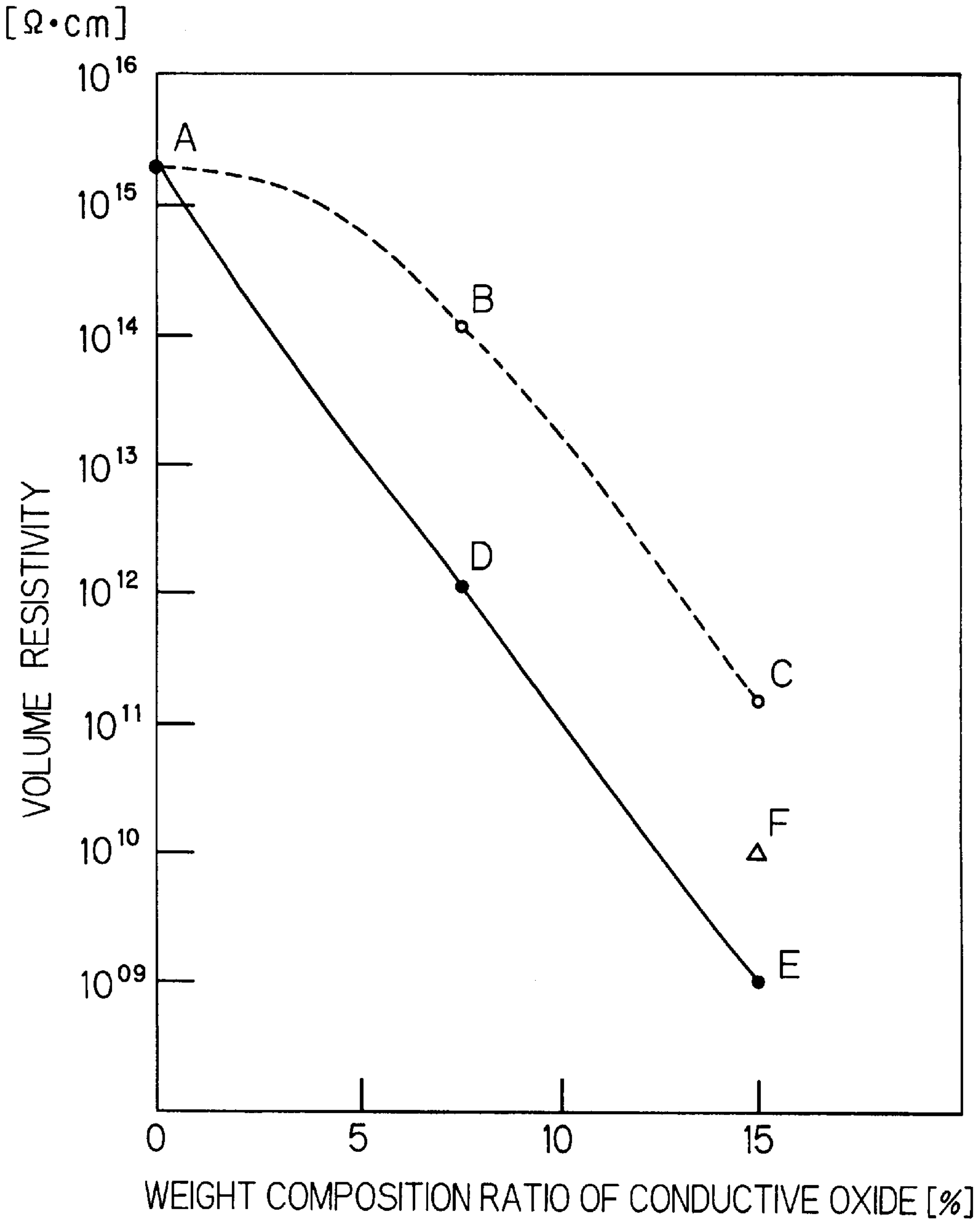
FIG. 5 is a graph showing data related to volume resistivity of various glaze layers according to the present invention.

FIG. 5 is a two-dimensional graph on which the weight composition ratios (linear scale) and the volume resistivity values (log scale) of the conductive oxides contained in the respective samples are plotted. Referring to FIG. 5, the solid line is an approximate line connecting data of three samples, i.e., samples D and E employing $In_2O_3$ (grain size: 4.2 μm) as conductive oxide fillers and a sample A, with a parabola. On the other hand, the broken line is an approximate line connecting data of three samples, i.e., samples B and C employing $SnO_2$ (grain size: 0.8 μm) as conductive oxide fillers and the sample A, with a parabola.

The sample A corresponds to the conventional glaze layer 10 containing no conductive oxide filler. In the samples B to E and F, on the other hand, $Al_2O_3$ fillers of the sample A are partially or entirely replaced with various conductive oxide fillers. It is observed from Table 1 that the volume resistivity levels reduce as the replacement ratios increase in relation to the same conductive oxide fillers. As understood from the samples C and F, on the other hand, the volume resistivity levels reduce when the grain sizes increase, regardless of the weight composition ratios of $SnO_2$.

It has been recognized that the relative frequencies of spark discharge remarkably reduced in the samples B to F having the glaze layers 11 according to the present invention, as compared with the sample A employing the conventional glaze layer 10. Namely, the relative frequency was 100% in the sample A, while those in the samples B to F were 0 to 13%. Among the samples B to F, only the sample B having the volume resistivity value of $10^{13}$ Ω·cm recorded the relative frequency of 13%, while all of the remaining samples C to F having the volume resistivity values of not more than $10^{11}$ Ω·cm exhibited the relative frequencies of 0%. Thus, it has been confirmed that spark discharge can be suppressed as the volume resistivity of the glaze layer reduces.

Consideration is made on to what level the volume resistivity of the glaze layer 11 must reduce from the state of the sample A, in order to attain a better effect against spark discharge. The sample B has already attained the effect of reducing the relative frequency of spark discharge to 13%. Since the volume resistivity of the sample B is about 1/25 that of the sample A, it may be conceivable that the effect starts to remarkably appear when the volume resistivity of the glaze layer 11 reaches the level of 1/10 that of the sample A. According to FIG. 5, therefore, it is readable that the effect starts to remarkably appear when the weight composition ratio of $In_2O_3$ (grain size: 4.2 μm) occupying the glaze layer 11 is equal to 2% or more.

On the other hand, a level of at least 6% is readable as to $SnO_2$ (grain size: 0.8 μm), while the effect is expected to appear even at a smaller level if the grain size increases on the analogy of the result of the sample F ($SnO_2$ (grain size: 3.1 μm)), and it is conceivable that the effect starts to remarkably appear even at 2% similarly to $In_2O_3$ (grain size: 4.2 μm) if the grain size sufficiently increases.

No problem in driving arose in AC plasma display panels related to the samples B to F according to the present invention as compared with that of the conventional sample A. Thus, it can be said that the inventive prescription of reducing the volume resistivity of the glaze layer and suppressing spark discharge by introducing the conductive filler into the glaze layer is highly practical since the adjustment width of the volume resistivity can be considerably increased.

While the conductive fillers were prepared from $SnO_2$ and $In_2O_3$ in the aforementioned samples, it can be readily inferred that the target adjustment is sufficiently enabled by applying another conductive oxide, another conductive compound or another metal due to the large adjustment width of the volume resistivity of the glaze layer.

Second Embodiment

Figure 6:
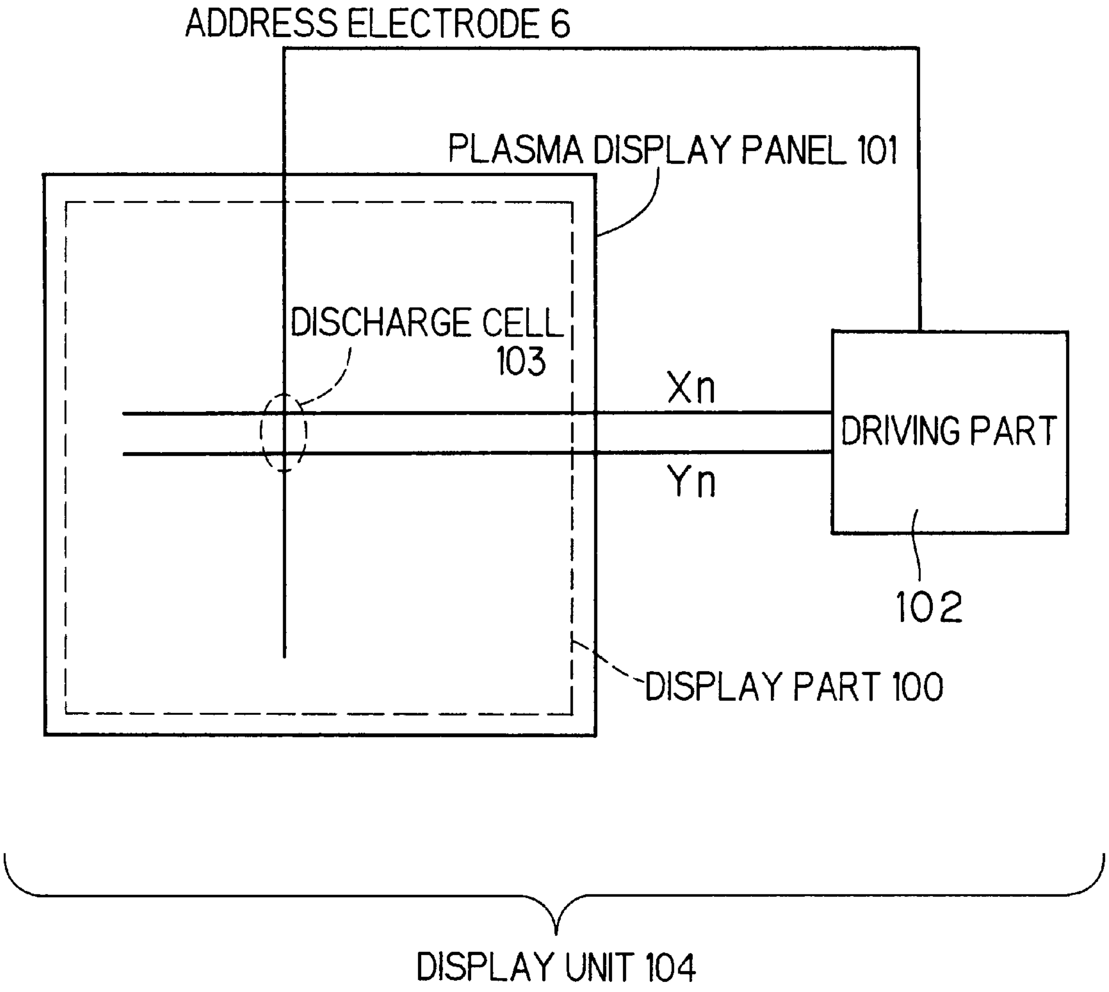
FIG. 6 is a block diagram showing a display unit according to the present invention.

FIG. 6 shows a display unit 104 employing an AC plasma display panel 101 having a glaze layer containing a proper amount of conductive filler in the aforementioned content. The volume resistivity of the glaze layer is lowly adjusted. Referring to FIG. 6, numeral 100 denotes a display part, which is formed by the AC plasma display panel 101 according to the present invention. Numeral 102 denotes a driving part, which properly generates write discharge, sustain discharge, priming discharge and erase discharge in each discharge cell 103 and drives/controls the same, in order to obtain a desired image. The driving sequence of the discharge is identical to that described with reference to the prior art. The display unit 104 having such a structure can reduce or eliminate spark discharge of the plasma display panel 101 generated during image display, whereby noise caused on the display part 100 can be reduced or eliminated.

While the invention has been shown and described in detail, the following description is in all aspects illustrative and restrictive. It is therefore understood that numerous modifications and variations can be devised without departing from the scope of the invention.

What is claimed is:

1. An AC plasma display panel comprising:

a first substrate;

a second substrate opposed to said first substrate to define a discharge space receiving a discharge gas therein between the opposed surfaces of said first and second substrates;

a plurality of sustain discharge electrode pairs being formed on said opposed surface of said first substrate in parallel with each other;

a dielectric member being formed on said opposed surface of said first substrate, said dielectric member covering said plurality of sustain discharge electrode pairs;

a plurality of address electrodes being formed on said opposed surface of said second substrate in a direction intersecting with that of said sustain discharge electrode pairs; and a glaze layer being formed on said opposed surface of said second substrate for covering said plurality of address electrodes, said glaze layer comprising a conductive member and having a volume resistivity of about $2.0\times10^{14}$ Ω·cm or below.

2. The AC plasma display panel according to claim 1, wherein said glaze layer is composed of a binder and a conductive filler dispersed therein, said conductive filler comprising a conductive oxide.

3. The AC plasma display panel according to claim 2 wherein the concentration of said conductive filler in said binder is sufficient to obtain a volume resistivity of about $2.0\times10^{14}$ Ω·cm or below.

4. The AC plasma display panel according to claim 2 wherein said binder is an insulating inorganic binder.

5. The AC plasma display panel according to claim 1 wherein said volume resistivity is about $7.9\times10^{13}$ Ω·cm or below.

6. An AC plasma display panel comprising:

a first substrate;

a second substrate opposed to said first substrate to define a discharge space receiving a discharge gas therein between the opposed surfaces of said first and second substrates a plurality of sustain discharge electrode pairs being formed on said opposed surface of said first substrate in parallel with each other;

a dielectric member being formed on said opposed surface of said first substrate, said dielectric member covering said plurality of sustain discharge electrode pairs;

a plurality of address electrodes being formed on said opposed surface of said second substrate in a direction intersecting with that of said sustain discharge electrode pairs; and a glaze layer being formed on said opposite surface of said second substrate for covering said plurality of address electrodes, said glaze layer comprising a conductive member, wherein said glaze layer is composed of an insulating inorganic binder and a conductive filler dispersed therein, said conductive filler comprising a conductive oxide, wherein the weight composition ratio of said conductive oxide is at least 2%.

7. The AC plasma display panel according to claim 6, wherein said conductive filler comprises tin oxide as said conductive oxide.

8. The AC plasma display panel according to claim 6, wherein said conductive filler comprises indium oxide as said conductive oxide.

9. A display unit comprising:

a display part; and a driving part being connected to first, second and third electrodes of each discharge cell of said display part, said driving part supplying a driving signal for displaying an image on said display part to each of said first to third electrodes, said display part comprising:

a first substrate;

a second substrate opposed to said first substrate to define a discharge space receiving a discharge gas therein between the opposed surfaces of said first and second substrates;

a plurality of sustain discharge electrode pairs being formed on said opposed surface of said first substrate in parallel with each other, each of said plurality of sustain discharge electrode pairs comprising said first and second electrodes;

a dielectric member being formed on said opposed surface of said first substrate, said dielectric member covering said plurality of sustain discharge electrode pairs;

a plurality of address electrodes being formed on said opposed surface of said second substrate in a direction intersecting with that of said first and second electrodes, each of said plurality of address electrodes corresponding to a said third electrode; and a glaze layer being formed on a second part of said opposite surface of said second substrate, covering said plurality of address electrodes, comprising a conductive member and having a volume resistivity of less than about $2.0\times10^{14}$ Ω·cm or below.

10. The display unit according to claim 9, wherein said glaze layer is composed of a binder and a conductive filler being dispersed therein, said conductive filler comprising a conductive oxide.

11. The display unit according to claim 10 wherein the concentration of said conductive filler in said binder is sufficient to obtain a volume resistivity of about $2.0\times10^{14}$ Ω·cm or below.

12. The display unit according to claim 9 wherein said volume resistivity is about $7.9\times10^{13}$ Ω·cm or below.

13. An AC plasma display panel substrate comprising:

a substrate;

a plurality of electrode lines formed on a major surface of said substrate in parallel with each other; and a glaze layer, formed on of said major surface of said substrate to substantially entirely cover said plurality of electrode lines, comprising a conductive member and having a volume resistivity of about $2.0\times10^{14}$ Ω·cm or below.

14. The AC plasma display panel substrate according to claim 13, wherein said glaze layer is composed of a binder and a conductive filler being dispersed therein, said conductive filler comprising a conductive oxide.

15. The AC plasma display panel substrate according to claim 14 wherein the concentration of said conductive filler in said binder is sufficient to obtain a volume resistivity of about $2.0\times10^{14}$ Ω·cm or below.

16. The AC plasma display panel substrate according to claim 13 wherein said volume resistivity is about $7.9\times10^{13}$ Ω·cm or below.

17. A method of manufacturing an AC display panel comprising:

a) forming a display panel substrate assembly by,
  i) supplying a display panel substrate,
  ii) forming a plurality of electrode lines on a first surface of said substrate, and
  iii) depositing a conductive layer of a composition of a conductive filler dispersed in a binder to form a glaze layer on said first surface of said substrate overlying said plurality of electrode lines, the concentration of said conductive filler being sufficient so that said conductive layer, when cured, exhibits a volume resistivity of about $2.0\times10^{14}$ Ω·cm or below; and b) making a display with said display panel substrate assembly.

* * * * *

UNITED STATES PATENT AND TRADEMARK OFFICE

CERTIFICATE OF CORRECTION

PATENT NO. : 6,114,748

DATED : September 5, 2000
INVENTOR(S) : Shinichiro Nagano et al.

It is certified that error appears in the above-identified patent and that said Letters Patent is hereby corrected as shown below:

<u>Column 8,</u>
Line 48, change "conductive oxides contained" to -- glaze layers --.

<u>Column 12,</u>
Line 11, change "formed on of" to -- formed on --.

Signed and Sealed this

Eighteenth Day of December, 2001

*Attest:*

JAMES E. ROGAN

*Attesting Officer*

*Director of the United States Patent and Trademark Office*

UNITED STATES PATENT AND TRADEMARK OFFICE

CERTIFICATE OF CORRECTION

PATENT NO. : 6,114,748 
DATED : September 5, 2000
INVENTOR(S) : Shinichiro Nagano et al.

It is certified that error appears in the above-identified patent and that said Letters Patent is hereby corrected as shown below:

Column 2,
Line 51-52, change "a span of several 10s of to one hundred and several 10 barrier ribs 7" to -- a span of several tens of to one hundred and several tens of barrier ribs 7 --.

Signed and Sealed this

Seventh Day of September, 2004

JON W. DUDAS
*Director of the United States Patent and Trademark Office*